(12) United States Patent
Wang et al.

(10) Patent No.: US 10,988,049 B2
(45) Date of Patent: Apr. 27, 2021

(54) POWER MANAGEMENT OF HIGH-CURRENT FAST-CHARGING BATTERY

(71) Applicant: GM GLOBAL TECHNOLOGY OPERATIONS LLC, Detroit, MI (US)

(72) Inventors: Yue-Yun Wang, Troy, MI (US); Garrett M. Seeman, Novi, MI (US); Jeffrey S. Piasecki, Rochester, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 81 days.

(21) Appl. No.: 16/414,294

(22) Filed: May 16, 2019

(65) Prior Publication Data
US 2020/0361340 A1 Nov. 19, 2020

(51) Int. Cl.
*B60L 58/21* (2019.01)
*G01R 31/367* (2019.01)
(Continued)

(52) U.S. Cl.
CPC ............. *B60L 58/21* (2019.02); *B60L 58/12* (2019.02); *B60L 58/18* (2019.02); *G01R 31/367* (2019.01);
(Continued)

(58) Field of Classification Search
CPC ......... B60L 58/10–27; B60L 50/60–66; B60L 53/11; H02J 7/0013–0025;
(Continued)

(56) References Cited

U.S. PATENT DOCUMENTS

| | | | |
|---|---|---|---|
| 2007/0069692 A1* | 3/2007 | Melichar | G01R 31/3647 320/128 |
| 2008/0007224 A1* | 1/2008 | Melichar | G01R 31/3842 320/132 |

(Continued)

OTHER PUBLICATIONS

A. Farmann, D.U. Sauer, "A comprehensive review of on-board State-of-Available-Power prediction techniques for lithium-ion batteries in electric vehicles", Oct. 15, 2016, Journal of Power Sources, vol. 329, pp. 123-137 (Year: 2016).*

T. Bruen, J. Marco, "Modelling and experimental evaluation of parallel connected lithium ion cells for an electric vehicle battery system", Apr. 1, 2016, Journal of Power Sources, vol. 310, pp. 91-101 (Year: 2016).*

*Primary Examiner* — Rexford N Barnie
*Assistant Examiner* — David A Shiao
(74) *Attorney, Agent, or Firm* — Quinn IP Law

(57) ABSTRACT

Powerflow is managed using a method, e.g., in a powertrain system having a multi-pack rechargeable energy storage system (RESS) with parallel battery packs. Each pack has a corresponding maximum electrical (current or voltage) limit. The method includes predicting a corresponding terminal voltage for each pack using the corresponding maximum electrical limit. The method includes selecting a terminal voltage as a selected voltage based on a requested operating mode, including selecting a maximum of the terminal voltages when the requested operating mode is a discharging mode and a minimum of the same when the requested operating mode is a charging mode. A pack current through each pack is predicted using the selected voltage and a corresponding battery state space model. A total power capability of the RESS is predicted over a predetermined prediction horizon using the selected voltage, with the operating mode controlled over the prediction horizon via the controller.

18 Claims, 6 Drawing Sheets

(51) Int. Cl.
*B60L 58/18* (2019.01)
*H02J 7/00* (2006.01)
*B60L 58/12* (2019.01)
*B60L 53/10* (2019.01)

(52) U.S. Cl.
CPC ............. *H02J 7/0013* (2013.01); *B60L 53/11* (2019.02); *B60L 2240/547* (2013.01); *B60L 2240/549* (2013.01); *B60Y 2200/91* (2013.01); *B60Y 2300/91* (2013.01)

(58) Field of Classification Search
CPC .......... H02J 7/0047–005; H02J 7/1423; G01R 31/36–396
See application file for complete search history.

(56) References Cited

U.S. PATENT DOCUMENTS

| | | | | |
|---|---|---|---|---|
| 2012/0101674 | A1* | 4/2012 | Wang | G01R 31/367 701/22 |
| 2016/0039419 | A1* | 2/2016 | Wampler | B60W 40/12 701/22 |
| 2016/0187429 | A1* | 6/2016 | Kawai | G01R 31/367 702/63 |
| 2016/0363629 | A1* | 12/2016 | Frost | B60W 10/26 |
| 2018/0059190 | A1* | 3/2018 | Verbrugge | G01R 31/3842 |
| 2019/0181657 | A1* | 6/2019 | Deshpande | B60L 50/16 |
| 2020/0176829 | A1* | 6/2020 | Nishikawa | H01M 10/486 |

* cited by examiner

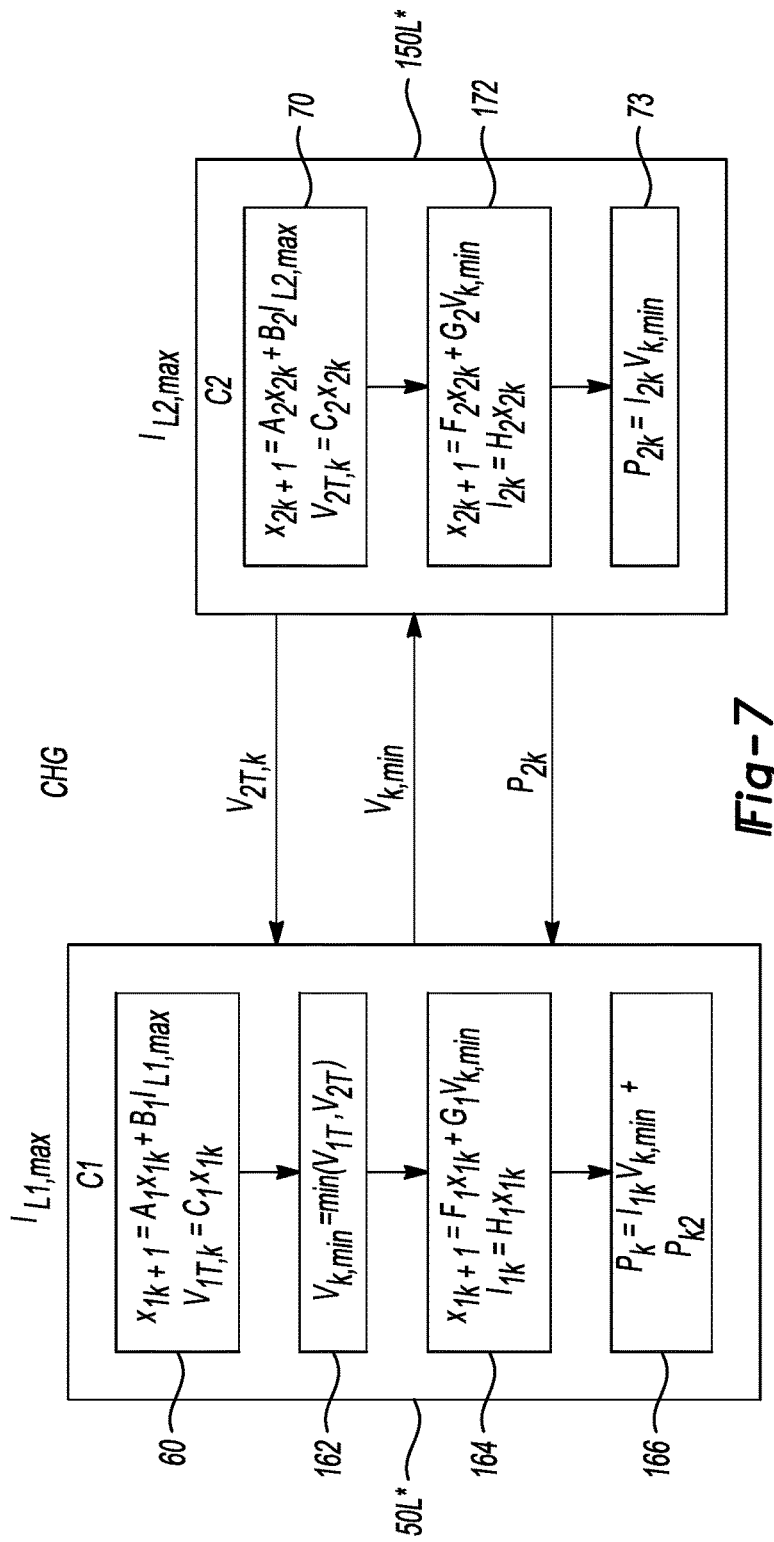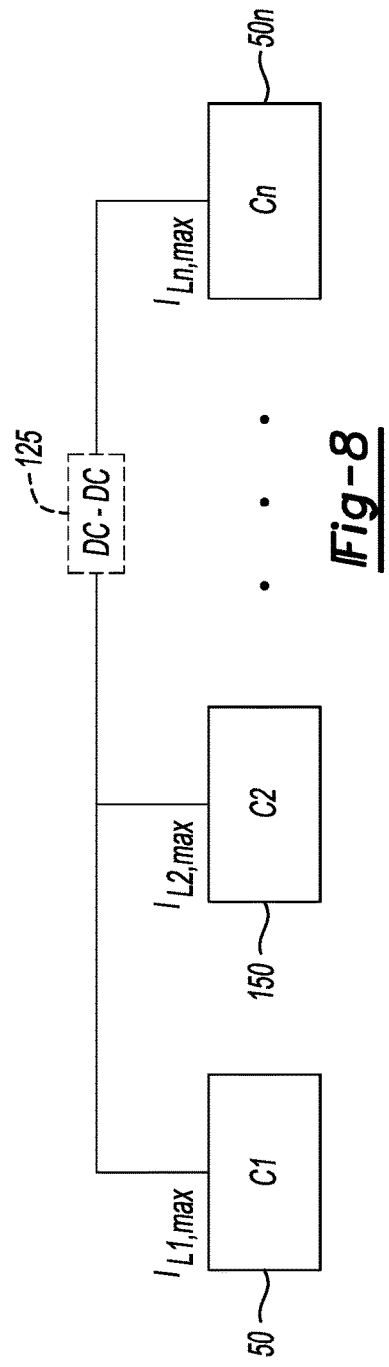

POWER MANAGEMENT OF HIGH-CURRENT FAST-CHARGING BATTERY

INTRODUCTION

A rechargeable energy storage system (RESS) is a core component of a high-voltage electrical system. When the RESS is configured as an electric battery having multiple battery cells, the constituent battery cells are collectively operable for storing or releasing electrochemical energy as needed during a given operating mode. For instance, stored electrical energy may be delivered to an electric machine or other electrical load during a discharging mode, e.g., a drive mode when the RESS is used as part of an electrified powertrain. The battery cells may be selectively recharged using an offboard charging station in some RESS configurations, with the charging process possibly expedited using a direct current fast-charging process. Battery controllers in communication with the RESS may be used to monitor the ongoing performance of the RESS, as well as to manage powerflow to and from the individual battery cells.

SUMMARY

The present disclosure relates to improved methods for managing powerflow of a multi-pack RESS, i.e., an RESS having two or more parallel-connected ("P-connected") battery packs. Instantaneous power capability of the multi-pack RESS is estimated over a forward-looking prediction horizon, for instance 0.1 seconds (s), 1 s, 2 s, 10 s, and 20 s into the future. In its simplest form, a circuit topology as disclosed herein includes a pair of such battery packs, with each battery pack having a corresponding mechanical or solid-state switch connecting and disconnecting the battery pack to a direct current (DC) power bus. In other embodiments, three of more battery packs may be used. The multi-pack RESS may be selectively connected to an offboard fast-charging station during a charging mode of operation to recharge the battery packs, as noted above.

The controller, which may be alternatively embodied as a unitary controller or as multiple controllers, e.g., two or more vehicle integration control modules (VICMs) arranged in a server/client relationship or other hierarchical arrangement, is used to predict the total power capability of the multi-pack RESS when the multiple P-connected battery packs have different characteristics, possibly including but not limited to imbalanced states of charge, or different battery cell capacities, different cell chemistries, calibrated voltage and/or current limits, etc. The controller executes battery state-related logic to perform the present method such that the controller estimates a pack voltage across each of the multiple battery packs, and then predicts a corresponding pack current flowing through each battery pack. The controller then predicts the total power capability of the multi-pack RESS and thereafter controls operation of the RESS using the predicted power capability.

An embodiment of a method for managing powerflow of the multi-pack RESS includes predicting a corresponding first and second terminal voltage for first and second battery packs, respectively, via a controller. This is accomplished using a corresponding maximum electrical limit, e.g., a maximum current or voltage limits, which may be provided by a manufacturer of the battery packs or otherwise made available to the controller. The method includes receiving, via the controller, a requested operating mode of the multi-pack RESS, and then selecting the first or second terminal voltage as a selected voltage based on the requested operating mode. The larger/maximum of the terminal voltages may be selected when the requested operating mode is a discharging mode, while the smaller/minimum of the terminal voltages may be selected when the requested operating mode is a charging mode.

The method in this particular embodiment includes predicting a pack current flowing through each P-connected battery pack using the selected voltage and a corresponding battery state space model, and predicting a total power capability of the multi-pack RESS over a predetermined prediction horizon using the pack currents, which in turn generates predicted power capability values. The method further includes controlling the requested operating mode over the predetermined prediction horizon, via the controller, using the plurality of predicted power capability values.

The method may include receiving a fast-charging voltage and current from the noted offboard fast-charging station, via the multi-pack RESS, during a fast-charging operation. The requested operating mode in this case is the charging mode. Controlling the requested operating mode during such an embodiment occurs during the charging mode by controlling the fast-charging operation via the controller.

The requested operating mode may be the discharging mode, with the requested operating mode possibly including energizing a rotary electric machine via the multi-pack RESS and a power inverter module.

The predetermined prediction horizon may include at least five future time points (k), e.g., k=0.1 s, 1 s, 2 s, 10 s, and 20 s.

The controller in certain embodiments includes hierarchically-arranged first and second controllers. Predicting the second terminal voltage and the second pack current may be accomplished via the second controller using a second one of the battery state space models, with the predicted second terminal voltage and pack current communicated to the first controller. Predicting the first terminal voltage and the first pack current may be accomplished via the first controller using a first of the battery state space models, with the first controller also predicting the total power capability and controlling the requested operating mode. The first and second controllers may be embodied as first and second vehicle integration control modules of a motor vehicle.

In some embodiments, the battery state space models may include an equivalent circuit model with a plurality of battery parameters for the first and second battery packs, respectively. Example battery parameters include a state of charge, an open circuit voltage, and a battery impedance, e.g., RC circuit pairs. Alternatively, the battery state space model may use electrochemical models or other suitable battery state space model.

The multi-pack RESS optionally includes a third battery pack connected to the first and second battery packs via a DC-DC converter, such that the third battery pack has a pack voltage that is less than a pack voltage of the first and second battery packs. The optional third battery pack in some configurations may have a pack voltage of 48V and the first and second battery packs have a pack voltage of at least 370V.

A powertrain system is also disclosed herein having a multi-pack RESS, first and second switches, and parallel-connected first and second battery packs each connected to a DC voltage bus via a corresponding one of the first and second switches, respectively. First and second pack sensors are connected to the respective first and second battery packs, each sensor being operable for measuring a corresponding pack current, voltage, and temperature of the first and second battery pack. A power inverter module (PIM) is connected to the multi-pack RESS, and a rotary electric machine connected to the PIM has an output member coupled to a load. A controller is configured to receive the pack currents, voltages, and temperatures from the sensors, and to execute the above-noted method using such measurements.

The above summary is not intended to represent every embodiment or every aspect of the present disclosure. Rather, the foregoing summary merely provides an exemplification of some of the novel aspects and features set forth herein. The above features and advantages, and other features and advantages of the present disclosure, will be readily apparent from the following detailed description of representative embodiments and modes for carrying out the present disclosure when taken in connection with the accompanying drawings and the appended claims.

BRIEF DESCRIPTION OF THE DRAWINGS

FIGS. 6 and 7 are schematic logic diagrams describing model-based information flow in the exemplary multi-controller topology of FIG. 3 during a discharging mode and a charging mode of a multi-pack RESS, respectively.

FIG. 8 is a schematic multi-controller setup according to the present disclosure.

Figure 1:
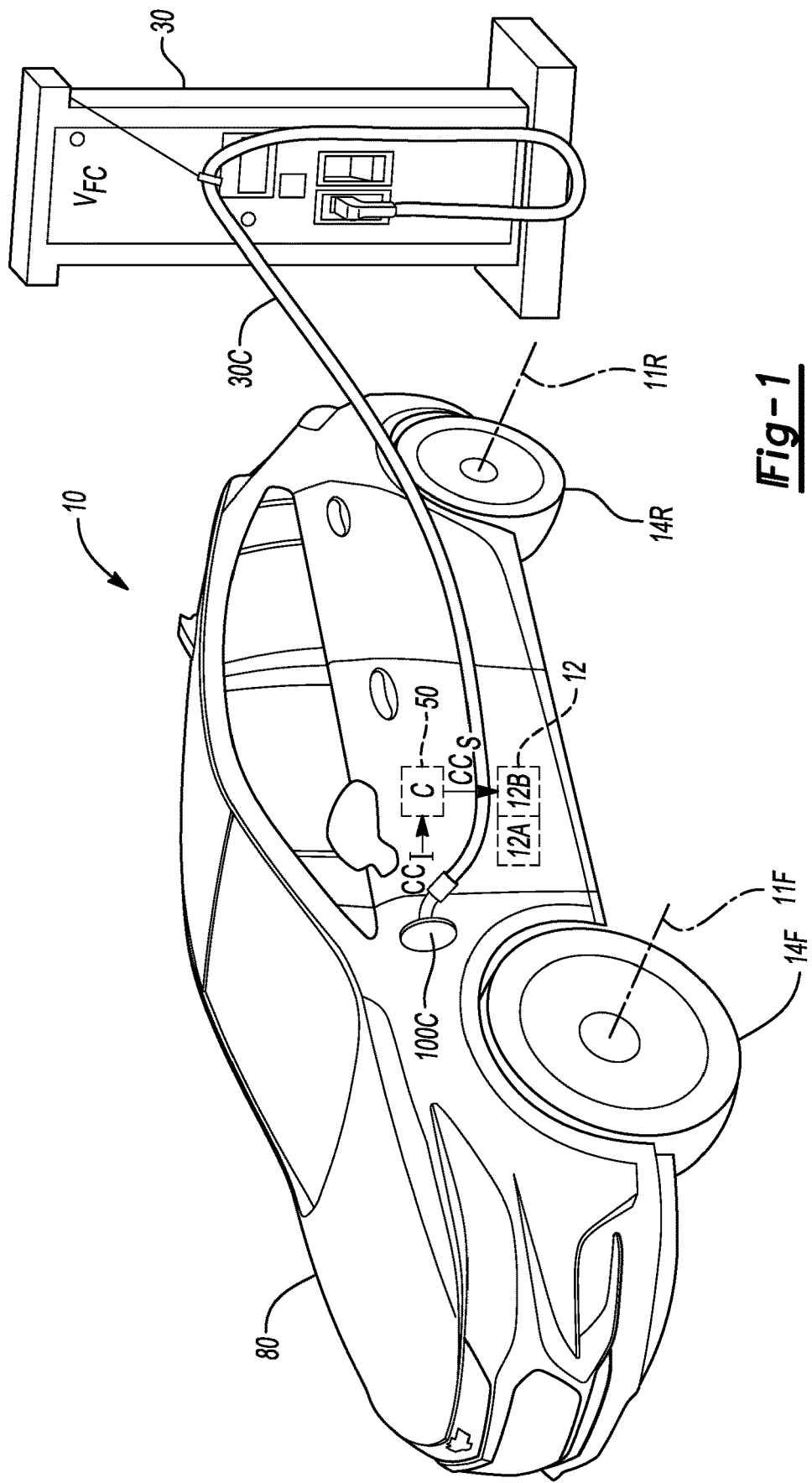
FIG. 1 is a schematic illustration of an example motor vehicle undergoing a fast-charging operation, with the motor vehicle having a multi-pack rechargeable energy storage system ("RESS") constructed from multiple parallel-connected battery packs, the power capability of which is estimated in real-time over a forward-looking time horizon and applied by a resident battery controller during charging and discharging modes of operation as described herein.

The present disclosure is susceptible to modifications and alternative forms, with representative embodiments shown by way of example in the drawings and described in detail below. Inventive aspects of this disclosure are not limited to the disclosed embodiments. Rather, the present disclosure is intended to cover modifications, equivalents, combinations, and alternatives falling within the scope of the disclosure as defined by the appended claims.

DETAILED DESCRIPTION

Referring to the drawings, wherein like reference numbers refer to the same or like components in the several Figures, a motor vehicle 10 is depicted in FIG. 1 as an example electrified system having a multi-pack rechargeable energy storage system ("RESS") 12. The multi-pack RESS 12 two or more parallel-connected ("P-connected") battery packs, which are schematically depicted in FIG. 1 as first and second battery packs 12A and 12B, respectively. The first and second battery packs 12A and 12B may each have a maximum voltage/energy capability of 370-400V/60 kWh in a non-limiting example high-voltage embodiment. Such an embodiment may be beneficial for applications in which the multi-pack RESS 12 is used to power high-voltage traction and/or power generation functions aboard the motor vehicle 10 or to powers another load when the motor vehicle 10 is embodied as a marine vessel, aircraft, watercraft, rail vehicle, powerplant, etc., such as propellers or a drive shaft. For illustrative consistency, the motor vehicle 10 will be described hereinafter as an example application of the present teachings without limiting such applications to the depicted embodiment.

A controller (C) 50 embodied as an onboard/resident electronic control unit is used to manage powerflow to and from the multi-pack RESS 12. Although omitted for illustrative clarity from FIG. 1, the controller 50, responsive to a threshold imbalance in a state of charge of the first and second battery packs 12A and 12B, may be configured to command automatically balancing of the state of charge using open/closed state control of a cell balancing circuit (not shown), as will be appreciated by those of ordinary skill in the art. The controller 50 is also configured to execute the present method 100 of FIG. 5 using the example control logic 50L, 150L, 50L*, and 150L* of FIGS. 6 and 7, doing so using one of the disclosed controller configurations of FIG. 2-4 or 8.

The example motor vehicle 10 includes front and rear drive wheels 14F and 14R, respectively, which rotate about a respective front and rear drive axis 11F and 11R. The motor vehicle 10 may be variously embodied as a plug-in electric vehicle having the multi-pack RESS 12, e.g., a multi-cell lithium ion, zinc-air, nickel-metal hydride, or lead acid type battery system, that can be selectively recharged via a DC fast-charging voltage ($V_{FC}$) from an off-board DC fast-charging station 30. During such an operation, the multi-pack RESS 12 is electrically connected to the off-board DC fast-charging station 30 via a charging port 100C located at an accessible part of a body 80 of the motor vehicle 10. The charging port 100C is connected to a DC charge connector (not shown) disposed at the end of a length of charging cable 30C. Such a connector may be embodied as an SAE J1772, a CHAdeMO charge connector, or another suitable regional or national standard charging plug or connector. However, the present teachings are independent of the charging standard ultimately employed in a DC fast-charging operation involving the DC fast-charging station 30, and therefore the above-noted examples are merely illustrative of the present teachings.

Figure 2:
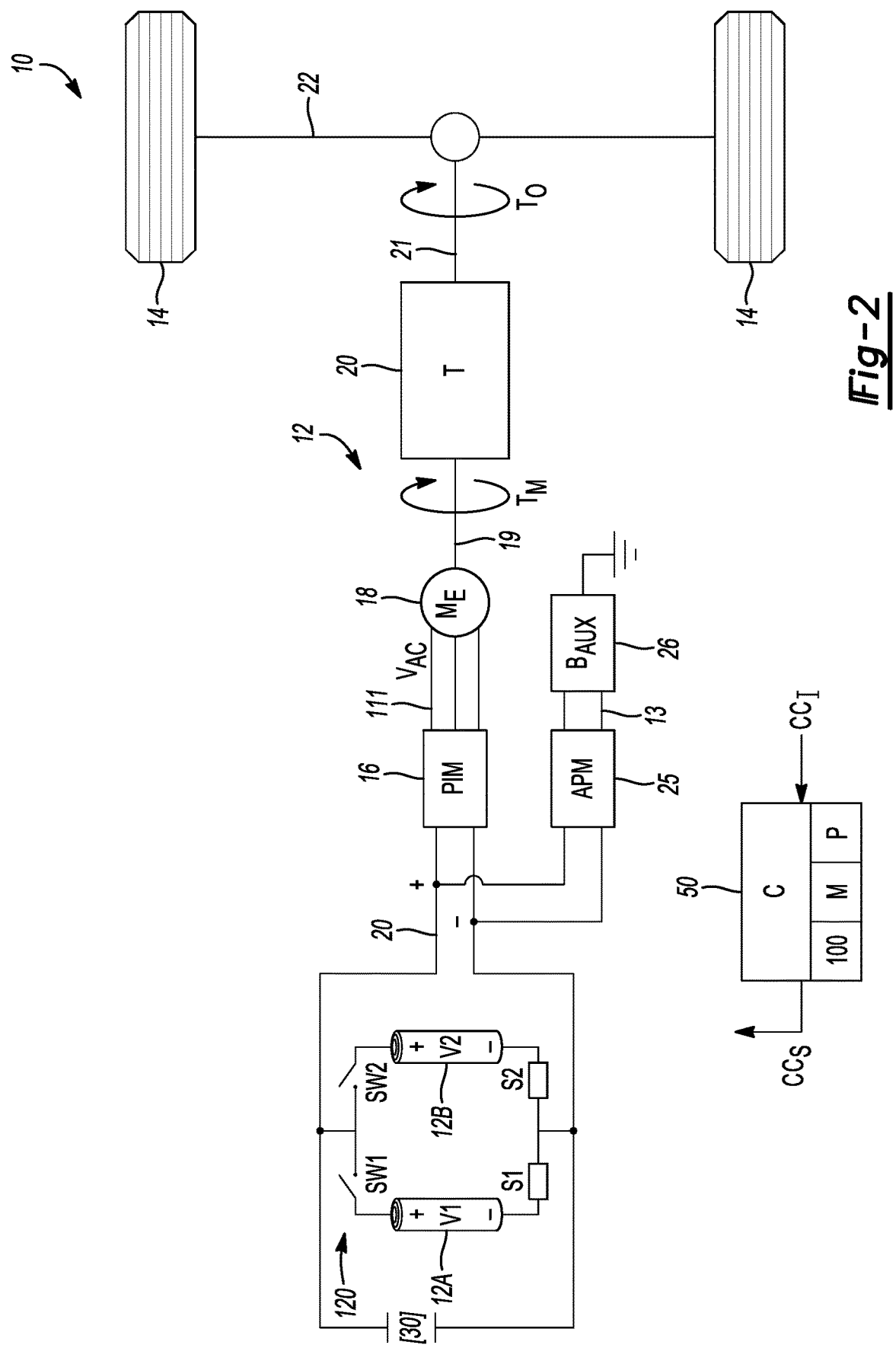
FIG. 2 is a schematic illustration of a motor vehicle having an exemplary dual-pack RESS and an associated battery controller.

Referring to FIG. 2, the motor vehicle 10 may include an electrified powertrain system 24, having the above-described multi-pack RESS 12, a power inverter module (PIM) 16, a rotary electric machine ($M_E$) 18, and a transmission (T) 20. The powertrain system 24 includes a DC voltage bus 11 and an AC voltage bus 111 ($V_{AC}$), with the PIM 16 operable for inverting a DC voltage on the DC voltage bus 11 to an AC voltage on the AC voltage bus 111 and vice versa as needed, e.g., in response to pulse width modulation signals as will be appreciated by those of ordinary skill in the art. To that end, upper and lower switches (not shown) internal to the PIM 16, e.g., IGBTs or MOSFETs, have binary on/off switching states that are controlled in real time to generate a desired output voltage from the PIM 16.

Additional components may be connected to the DC voltage bus 11, with one such component being an auxiliary power module (APM) 25, i.e., a DC-DC voltage converter 125 as shown in FIG. 8. A low-voltage/auxiliary battery ($B_{AUX}$) 26 may be connected to the APM 25 via another DC voltage bus 13, with the DC voltage bus 13 having a potential of 12-15V or 48V in different embodiments. The AC voltage bus 111 is connected to individual phase windings of the electric machine 18, with a three-phase embodiment of the electric machine 18 depicted in FIG. 3. The energized electric machine 18 delivers motor torque (arrow $T_M$) to an input member 19 of the transmission 20. Output torque (arrow $T_O$) is ultimately transferred to an output member 21 of the transmission 20, and ultimately to drive wheels 14, e.g., the front and/or rear 14F and 14R shown in FIG. 1, via one or more drive axles 22.

With respect to operation of the multi-pack RESS 12, switching state control and power estimation of the multi-pack RESS 12 is performed by the controller 50 using a processor (P) and memory (M). Switching state control occurs via transmission of switching control signals (arrow $CC_S$). The memory (M) includes tangible, non-transitory memory, e.g., read only memory, whether optical, magnetic, flash, or otherwise. The controller 50 also includes application-sufficient amounts of random access memory, electrically-erasable programmable read only memory, and the like, as well as a high-speed clock, analog-to-digital and digital-to-analog circuitry, and input/output circuitry and devices, as well as appropriate signal conditioning and buffer circuitry.

Figure 3:
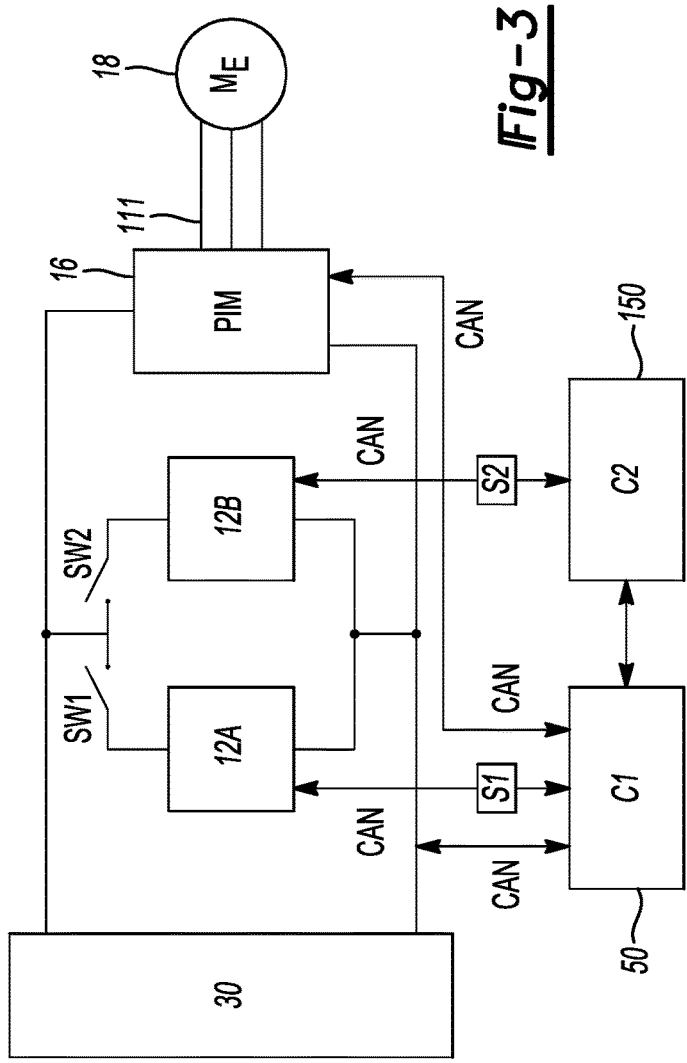
FIG. 3 is a schematic illustration of an alternative multi-controller configuration in which multiple controllers communicate in a hierarchical arrangement.
Figure 5:
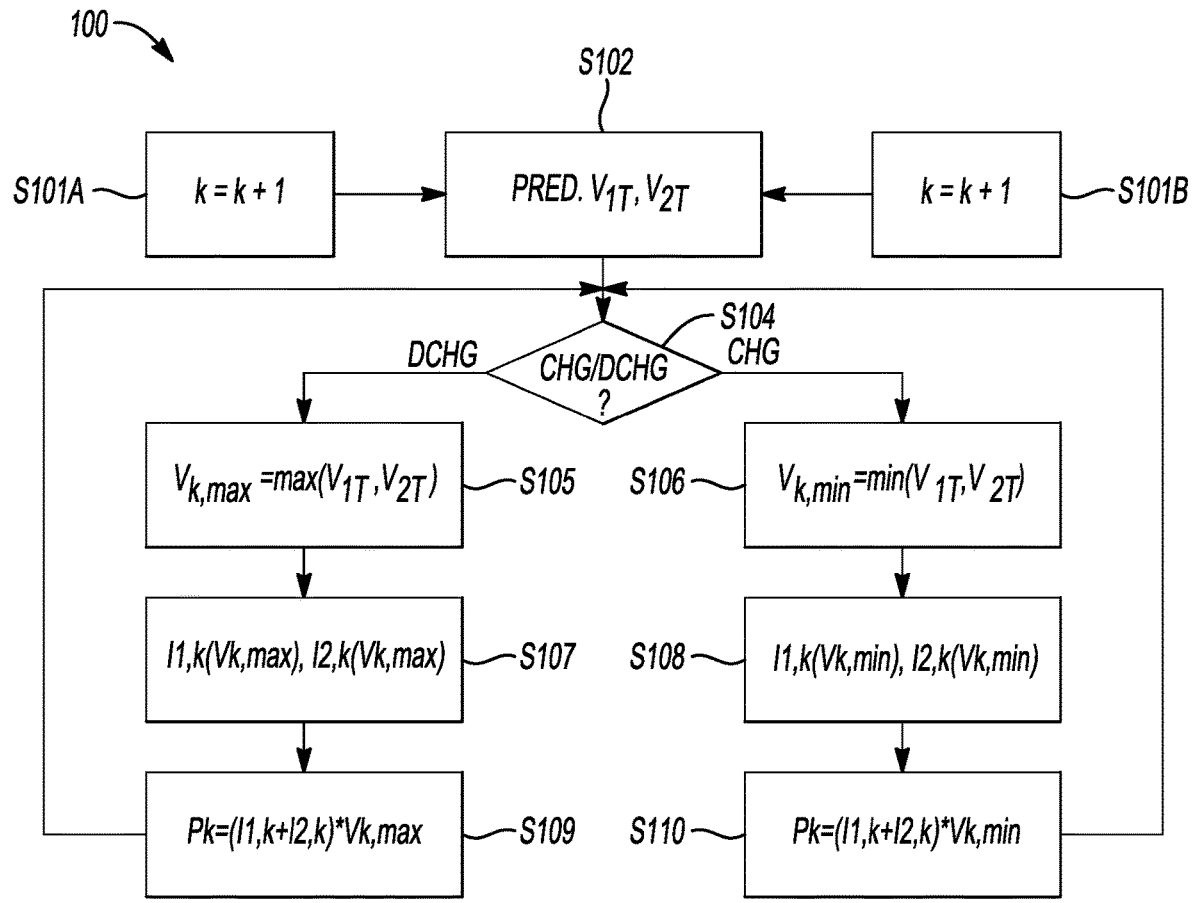
FIG. 5 is a flow chart describing an example method for estimating the total power capability of the multi-pack RESS depicted in FIGS. 1-3.

The controller 50 is programmed to execute instructions embodying the present power estimation method 100, an example embodiment of which is shown in FIG. 5, with the controller 50 receiving input signals (arrow $CC_I$) indicative of a driver-requested or autonomously-requested operating mode of the powertrain system 24, and including measured pack voltage, current, temperature, and/or other measured battery values from first and second pack sensors S1 and S2 of FIGS. 2 and 3. In response, the controller 50 outputs switching control signals (arrow $CC_S$) to a switching circuit 120 of the multi-pack RESS 12 and executes the method 100. In some instances, the input signals (arrow $CC_I$) may be received by the controller 50 during charging as part of ongoing communication between the controller 50 and the fast-charging station 30 of FIG. 1 upon connection of the motor vehicle 10 to the station 30, such as when the station 30 communicates a maximum charging voltage to the controller 50 and during an active charging event of the multi-pack RESS 12, or during ongoing drive operation of the motor vehicle 10.

In the non-limiting representative embodiment of FIG. 2, the switching circuit 120 includes respective first and second switches Sw1 and Sw2, which may be embodied as mechanical switches, solenoid-driven contactors, relays, or solid-state/semiconductor switches. Within the multi-pack RESS 12 itself, the example first and second battery packs 12A and 12B have respective first and second pack voltages V1 and V2. During a high-voltage fast-charging operation of the multi-pack RESS 12 in which the multi-pack RESS 12 is connected to the offboard fast-charging station 30 of FIG. 1, the controller 50 may determine the corresponding first and second pack voltages V1 and V2, e.g., via onboard measurement and/or calculation, as will be appreciated by those of ordinary skill in the art. The pack sensors S1 and S2 may be used to measure such pack voltages V1 and V2, as well as corresponding pack currents and pack temperatures as noted above, all of which are communicated to the controller 50 as part of the input signals (arrow $CC_I$).

Although shown schematically for illustrative simplicity, the respective first and second battery packs 12A and 12B each have a corresponding string of battery cells, with the number of such battery cells being application-specific. For instance, ninety-six such battery cells may be used in an example embodiment, with a cell voltage for each battery cell being about 4.0V to 4.5V. Each battery cell may have a corresponding cell balancing circuit such that a given battery cell may be selectively bypassed to enable excess energy to be drained from the first or second battery pack 12A or 12B, whichever has the higher pack voltage.

FIG. 3 depicts an alternative multi-controller topology in which the controller 50 of FIGS. 1 and 2 are embodied as first and second controllers C1 and C2 according to a communications protocol in which the second controller C2 acts as a client device to the first controller C1 in a server-client or other hierarchical arrangement. In such an embodiment, the first controller C1 may collect data from its pack sensors S1 describing operation of the first battery pack 12A, and may send and collect data to the second controller C2. The first controller C1, here operating as a main controller, also estimates performance of the first battery pack 12A and manages control of communication between the motor vehicle 10 and the fast-charging station 30 of FIG. 1.

The second controller C2 in such a hierarchical arrangement may collect data from its associated pack sensors S2 describing operation of the second battery pack 12B, receive data from and send data to the first controller C1, estimate performance of the second battery pack 12B, and then send the estimated performance of the second battery pack 12B to the first controller C1. In such a scheme, the first controller C1 acts as the main controller and thus functions as the battery system manager. As will be described below with reference to FIG. 8, the general approach shown in FIG. 3 may be extended to (n) battery packs with (n) controllers, such that (n) exceeds the two-pack embodiment of FIG. 3.

Power estimation in a typical P-connected battery arrangement, particularly in a new vehicle, typically assumes that the battery packs share a common battery chemistry and are well-balanced in terms of states of charge. For instance, in an example two-pack arrangement a first state of charge (SOC1) for a first hypothetical battery pack is assumed to be approximately equal to the state of charge (SOC2) of a second hypothetical battery pack, e.g., SOC1=SOC2. Given this baseline assumption, a battery controller could calculate current-limited and voltage-limited power as follows:

$$P_{I1}(t_i)=I_{L1}V_1(t_i,I_{L1})$$

$$P_{V1}(t_i)=I_1(t_i,V_{L1})V_{L1}$$

where P is power, $I_L$ is a current limit, $V_L$ is a voltage limit, and subscripts 1 and 2 correspond to the hypothetical first (1) and second (2) battery packs. Using the above formulation, a current-limited total system power ($P_I$) and a voltage-limited total system power ($P_V$) at time $t_i$ would be typically estimated as follows:

$$P_I=2P_{I1} \text{ or } P_V=2P_{V1}$$

However, such an approach becomes highly inaccurate when characteristics of P-connected battery packs begin to diverge from one another over time, e.g., due to different cell or pack chemistries, different ages, repair histories, or other factors. The present method 100 is therefore intended to solve this particular problem and thereby produce more accurate power estimates in the overall control of a multi-pack RESS, such as the embodiment shown at 12 in FIGS. 1 and 2.

Figure 4:
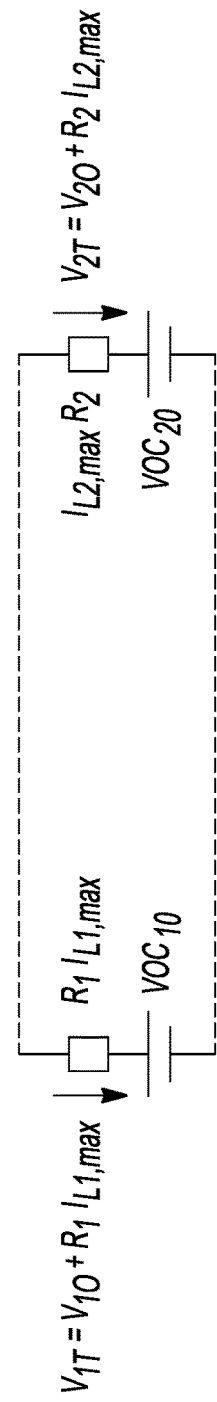
FIG. 4 is schematic simplified circuit diagram generally describing terminal voltage estimation as part of the present method.

Referring briefly to FIG. 4, an example discharging case is one in which the state of charge of one P-connected battery pack exceeds that of another P-connected battery pack by a significant amount. As will be appreciated, the higher the terminal voltage of a given battery pack, the smaller the pack current flowing through that particular battery pack. Likewise, a lower terminal voltage corresponds to a higher pack current. In FIG. 4, which shows a simplified representative circuit having two P-connected battery packs, the open-circuit voltage of one battery pack is represented as $VOC_{10}$, with the battery pack having a pack resistance $R_1$ and a maximum current limit $I_{L1,max}$. Likewise, a parallel battery pack in FIG. 4 has a pack resistance $R_2$ and a maximum current limit $I_{L2,max}$. Thus, the terminal voltages ($V_{1T}$ and $V_{2T}$) of the first and second battery packs 12A and 12B may be derived as follows:

$$V_{1T}=V_{10}+R_1 I_{L1,max}$$

$$V_{2T}=V_{20}+R_2 I_{L2,max}$$

In order for the first and second battery packs 12A and 12B of the present disclosure to satisfy their respective maximum current limits ($I_{L1}, I_{L2}$), the controller 50 (e.g., the first controller C1) at a sample time (i) determines the selected voltage:

$$V_{max}(i)=\max[V_{1T}(I_{L1max}), V_{2T}(I_{L2max})].$$

with $V_{max}$ being the current-limited voltage for the multi-pack RESS 12. As an example, if $V_{10}$ is much higher than $V_{20}$, the controller 50 assumes $V_{max}=V_{1T}$, such that the current-limited total power ($P_1$) for the multi-pack RESS 12, i.e., battery pack 12A and battery pack 12B, is determined using the following equation:

$$P(i)=I_{L1max}V_{max}(i)+I_2(V_{max}(i))V_{max}(i).$$

where $I_2(V_{max}(i))$ represents the battery pack 12B current predicted with the selected battery voltage $V_{max}(i)$ at sample time i. In general, the discharge currents for the first and second battery packs 12A and 12B are negative.

FIG. 5 depicts a flowchart describing the present method 100, which may be used in single controller or multi-controller configurations as shown in FIGS. 1-3 and 8 to estimate power capability of the multi-pack RESS 12 under discharging and charging modes of operation. For simplicity, the controller 50 is described below as performing the various steps of the method 100 regardless of how many controllers are actually used in a particular implementation. FIG. 5 is described with reference to FIG. 6 (discharging mode) and FIG. 7 (charging mode) as an exemplary illustration of the present teachings.

Beginning with steps S101A and S101B, the sample time (k) is incremented. The method 100 proceeds to step S102 when the sample time (k) has been incremented for the present iteration.

At step S102, the controller 50 predicts the terminal voltages ($V_{1T}$, $V_{2T}$) for the respective first and second battery packs 12A and 12B ("PRED. V1T, V2T"). That is, a corresponding calibrated current limit ($I_{L1}, I_{L2}$) exists for each of the P-connected battery packs, which may be provided by a manufacturer of the battery packs 12A and 12B. Given such calibrated current limits, the controller 50 predicts the terminal voltages ($V_{1T}$, $V_{2T}$) for each battery pack 12A and 12B separately at sample time k as noted above, doing so using the battery state space model. The method 100 then proceeds to step S104.

At step S104, the controller 50 determines whether the multi-pack RESS 12 is charging ("CHG") or discharging ("DCHG"), e.g., using the input signals (arrow $CC_I$) of FIG. 1. The method 100 proceeds to step S105 when the controller 50 determines that the present mode of operation is a discharging mode, and to step S106 in the alternative when the present mode is a charging mode.

Step S105 entails defining a parallel-connected maximum voltage $V_{k,max}$ as the maximum of the predicted two terminal voltages noted above, i.e.:

$$V_{k,max}(V_{1T}, V_{2T}).$$

The method 100 then proceeds to step S107.

At step S106, the controller 50 next defines a minimum parallel-connected voltage $V_{k,min}$ as the minimum of the predicted two terminal voltages noted above in step S102, i.e., $$V_{k,min}=\min(V_{1T}, V_{2T}).$$

The method 100 then proceeds to step S108.

Step S107 includes using the maximum voltage $V_{k,max}$ from step S105 to predict the pack currents through the first and second battery packs 12A and 12B. Step S107 may entail using separate battery state space models for each of the respective first and second battery packs 12A and 12B, i.e.:

$$I_{1,k}(V_{k,max}) \text{ and } I_{2,k}(V_{k,max}).$$

The method 100 then proceeds to step S109.

Step S108 includes using the minimum voltage $V_{k,min}$ from step S106 to predict the pack currents through the first and second battery packs 12A and 12B. as with step S107, Step S108 may entail using separate battery state space models for each of the first and second battery packs 12A and 12B, i.e.:

$$I_{1,k}(V_{k,min}) \text{ and } I_{2,k}(V_{k,min}).$$

The method 100 then proceeds to step S109.

At step S109, the controller 50 next predicts the total system power at time k, i.e., $P_k$, for an application-specific look-ahead prediction horizon, e.g., 0.1 s, 1 s, 2 s, 10 s, 20 s, etc., which in turn enables forward-looking powertrain control decisions to be made by the controller 50 in real-time. As a general formulation:

$$P_k=(I_{1k}+I_{2k})V_{k,max}.$$

Due to imbalance of the first and second battery packs 12A and 12B, the pack currents may have positive or negative signs, with a positive sign being indicative of a weaker pack that draws current from the stronger of the first and second battery packs 12A and 12B.

Step S110 entails predicting the total system power $P_k$ for the charging situation. The formulation is similar to that expressed above for step S109, but for the minimum voltage ($V_{k,min}$):

$$P_k=(I_{1k}+I_{2k})V_{k,min}.$$

Due to imbalance of the first and second battery packs 12A and 12B, the pack currents may have positive or negative signs, with negative sign being indicative of a stronger of the first and second battery packs 12A and 12B charging the weaker of the first and second battery packs 12A and 12B.

Discharging Case:

The discharging (DCHG) steps S105, S107, and S109 of FIG. 5 are described in further detail with reference to FIG. 6, which depicts implementation of the present method 100 using the example multi-controller topology of FIG. 3. That is, the first controller C1, e.g., a first vehicle integration control module (VICM) in the representative motor vehicle 10 of FIG. 1, communicates via a controller area network (CAN) bus or other communications channels with the second controller C2, e.g., a second VICM, in a server-client arrangement. As noted above, the first and second controllers C1 and C2 receive or are programmed with the maximum current limit ($I_{L1,max}$) and ($I_{L2,max}$) for the first and second battery packs 12A and 12B, respectively. Such calibration values may be provided by a manufacturer of the first and second battery packs 12A and 12B or otherwise made available to the first and second controllers C1 and C2.

The first and second controllers C1 and C2 are programmed with respective control logic 50L and 150L. The control logic 50L of first controller C1 includes logic blocks 60, 62, 64, and 66, while the control logic 150L of the second controller C2 includes logic blocks 70 and 72. Collectively, the various logic blocks form a battery state space model, which may be variously embodied as an equivalent circuit model, an electrochemical physics-based model, or other suitably representative model of the battery packs 12A and 12B.

Figure 6:
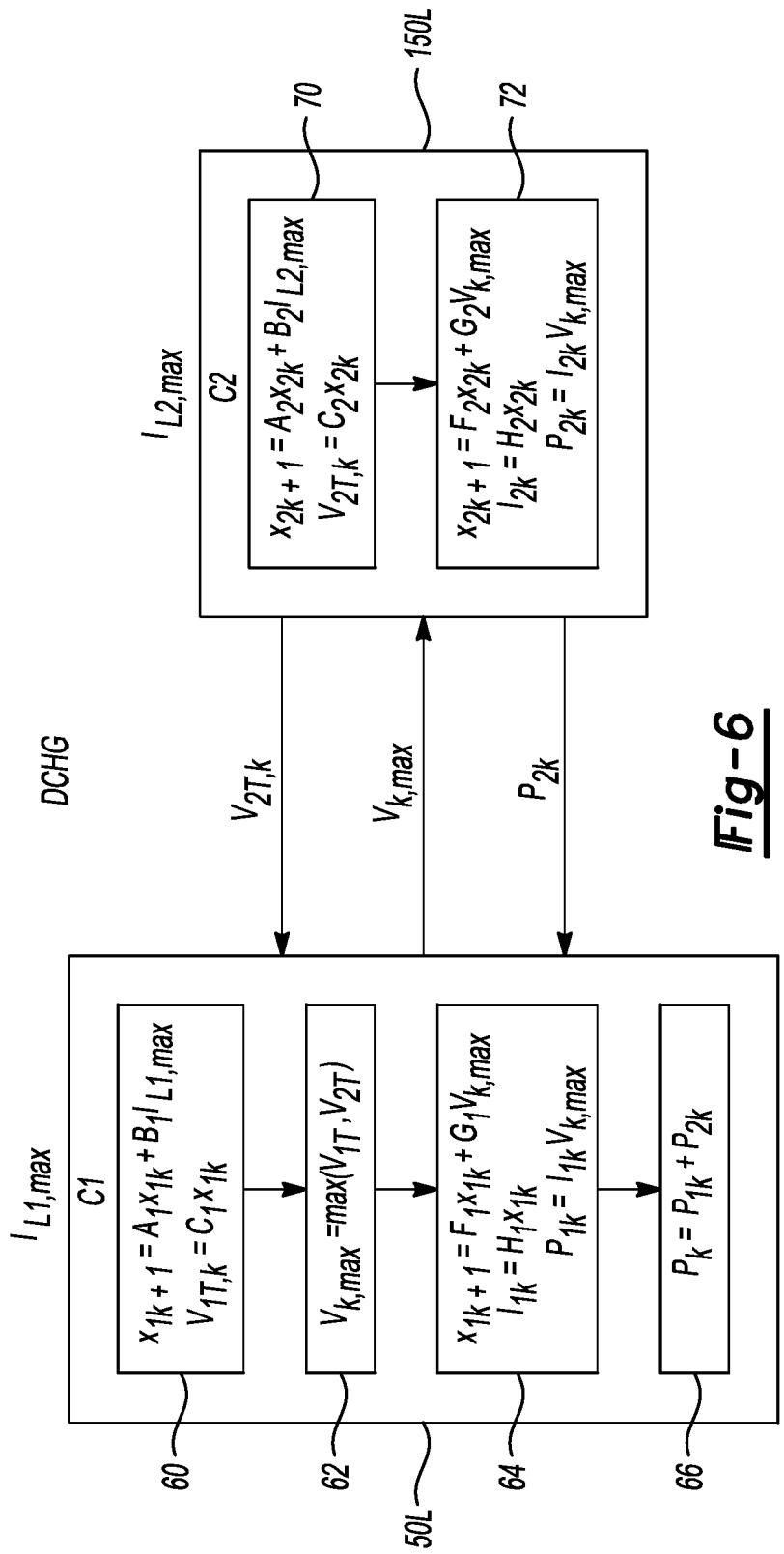

First Controller (C1):

The logic block 60 of FIG. 6 may be used to determine the terminal voltage of the first battery pack 12A at time point k, i.e., $V_{1T,k}$. In an example formulation:

$$x_{1k+1} = A_1 x_{1k} + B_1 I_{L1,max}$$

$$V_{1T,k} = C_1 x_{1k}$$

As will be appreciated, battery parameters in a battery state space model, here represented as parameters $A_1$, $B_1$, and $C_1$, as well as $F_1$, $G_1$, and $H_1$ described below, may be periodically updated using a Kalman filter and/or derived using parameters estimation techniques. The identity of the various battery parameters used in the respective battery state space models of first and second battery packs 12A and 12B may vary with the application. Illustrative example parameters include Ohmic losses, circuit resistance, state of charge, open-circuit voltage, capacitance, temperature, etc. The output of logic block 60, i.e., the terminal voltage $V_{1T,k}$ feeds into logic block 62.

Using logic block 62, the first controller C1 receives a calculated terminal voltage ($V_{2T}$) from the logic block 70 of the second controller C2, described below, and determines the maximum voltage $V_{k,max}$ at sample time k, i.e.:

$$V_{k,max} = \max(V_{1T}, V_{2T})$$

The maximum voltage $V_{k,max}$ is then fed into logic block 64, and is also fed as an input to the second controller C2.

Logic block 64 is then used to estimate the power capability of the first battery pack 12A, doing so using the maximum voltage from logic block 62. For instance:

$$x_{1k+1} = F_1 x_{1k} + G_1 V_{k,max}$$

$$I_{1k} = H_1 x_{1k}$$

$$P_{1k} = I_{1k} V_{k,max}$$

The first controller C1 feeds the estimated power capability of first battery pack 12A, i.e., the $P_{1k}$ value, into the logic block 66.

The first controller C1, using logic block 66, then estimates the total power capability of the multi-pack RESS 12 at each time point k as $P_k = P_{1k} + P_{2k}$, with the value $P_{2k}$ determined by the second controller C2 as set forth below. The process depicted in FIG. 6 is repeated for as many prediction time horizons as are required, e.g., k=0.1 s, 0.2 s, 1 s, 2 s, 10 s, 20 s, etc.

Second Controller (C2):

Logic blocks 70 and 72 are analogous to logic blocks 60 and 62, using battery state space parameters $A_2$, $B_2$, $C_2$, F $G_2$, and $H_2$, and allow the second controller C2 to estimate the terminal voltage $V_{2T,k}$ of the second battery pack 12B. In the discharging case, the described inverse model using voltage to calculate a pack current may be dismissed for the particular first or second battery pack 12A or 12B having the predicted maximum terminal voltage. Logic block 70 may be programmed with a state space model of the second battery pack 12B for this purpose, such as:

$$x_{2k+1} = A_2 x_{2k} + B_2 I_{L2,max}$$

$$V_{2T,k} = C_2 x_{2k}$$

The terminal voltage $V_{2T,k}$ is then fed into logic block 62 of the first controller C1 and used as set forth above.

Logic block 72 of the second controller C2 is analogous to logic block 64 of first controller C1, and ultimately estimates the power capability of the second battery pack 12B as follows:

$$x_{2k+1} = F_2 x_{2k} + G_2 V_{k,max}$$

$$I_{2k} = H_2 x_{2k}$$

$$P_{2k} = I_{2k} V_{k,max}$$

As with the pack current $I_{1k}$ noted above, the value $I_{2k}$ is derived using an inverse model, which estimates how much electric current passes through the second battery pack 12B when both packs 12A and 12B are connected, i.e., when the switch Sw1 and Sw2 of FIG. 2 are closed. The estimates peak power $P_{2k}$ of the second battery pack 12B is then fed into logic block 66 to calculate the estimated power $P_k$ for the multi-pack RESS 12.

Charging Case:

The charging (CHG) steps S106, S108, and S110 of FIG. 5 are described with reference to FIG. 7, which like FIG. 1 occurs using the multi-controller configuration of FIG. 2. FIG. 7 depicts control logic 50L* and 150L*, which are a variation of the control logic 50L and 150L shown in FIG. 6. In the charging case, maximum current-limited power prediction involves using an inverse model from voltage to calculate current may be disregarded for the first or second battery pack 12A or 12B having the predicted minimum terminal voltage. The control logic 50L* includes the logic block 60, which is described above with reference to FIG. 7, and logic block 162, 164, and 166.

First Controller (C1):

Using logic block 162, the first controller C1 receives a calculated terminal voltage ($V_{2T,k}$) from logic block 70 of the second controller C2 and determines the minimum voltage $V_{k,min}$ at sample time k, i.e.:

$$V_{k,min} = \min(V_{1T}, V_{2T})$$

The minimum value $V_{k,min}$ is then fed into logic block 164, and is also fed as an input to logic block 172 of the second controller C2.

Logic block 164 is then used to estimate the power capability of battery pack 12A, doing so using the minimum voltage from logic block 162. For instance:

$$x_{1k+1} = F_1 x_{1k} + G_1 V_{k,min}$$

$$I_{1k} = H_1 x_{1k}$$

The first controller C1 then feeds the estimated pack current $I_{1k}$ of first battery pack 12A, into logic block 166.

The first controller C1, using logic block 166, then estimates the total power capability of the battery at time point k as $P_k = I_{1k} V_{k,min} + P_{2k}$, with the value $P_{2k}$ determined by the second controller C2 as set forth below. The process depicted in FIG. 7 is then repeated for as many prediction time horizons as are required, e.g., k=0.1 s, 0.2 s, 1 s, 2 s, 10 s, 20 s, etc.

Second Controller (C2):

Logic block 172 of the second controller C2 ultimately estimates the power capability ($P_{2k}$) of the second battery pack 12B as follows:

$$x_{2k+1}=F_2 x_{2k}+G_2 V_{k,min}$$

$$I_{2k}=H_2 x_{2k}$$

$$P_{2k}=I_{2k} V_{k,min}$$

The estimated peak power $P_{2k}$ of the second battery pack 12B is then calculated at a logic block 73 and then fed into logic block 166 of the first controller C1 to calculate the estimated power $P_k$ for the multi-pack RESS 12.

In terms of the maximum electrical limit applied herein, instead of specifying maximum current limits for the first and second battery packs 12A and 12B as used in the forgoing illustrative examples, battery manufactures or vehicle OEMs may specify maximum voltage limits or minimum voltage limits for charging or discharging modes of operation. Thus, within the scope of the present method 100, steps S105 and S106 may be modified where the pack terminal voltages $V_{1T}$ and $V_{2T}$ are replaced by the given battery pack voltage limits. The selected voltage in the charging case takes the minimum value of the specified maximum voltage limits for both battery packs 12A and 12B. The selected voltage in discharging case takes the maximum value of the specified minimum voltage limits for both battery packs 12A and 12B. The remaining steps of the method 100 are then used to predict the total power capability.

Referring to FIG. 8, the above-described architecture and underlying methodology is well-suited to topologies using two parallel battery packs, e.g., first and second battery packs 12A and 12B. However, those of ordinary skill in the art in view of the forgoing disclosure will appreciate that more than two battery packs may be used. For instance, in an example (n)-pack configuration, where (n) is three or more battery packs, a DC-DC converter 125 may be used to reduce the voltage level, e.g., from nominal 400V (e.g., 370V) to 48V in a non-limiting example embodiment. The multi-controller architecture may be used in such an embodiment, with example first and second controller C1 and C2 joined by (n) additional controllers, such as additional VICMs.

Thus, single, dual, or multiple-VICM communication architectures may be envisioned for optimal battery management systems using P-connected battery packs for DC fast-charging and other high-power applications. The present approach enables instantaneous, short-term and long-term power prediction for two or more P-connected packs with individual or combined voltage and current limits.

While some of the best modes and other embodiments have been described in detail, various alternative designs and embodiments exist for practicing the present teachings defined in the appended claims. Those skilled in the art will recognize that modifications may be made to the disclosed embodiments without departing from the scope of the present disclosure. Moreover, the present concepts expressly include combinations and sub-combinations of the described elements and features. The detailed description and the drawings are supportive and descriptive of the present teachings, with the scope of the present teachings defined solely by the claims.

What is claimed is:

1. A method for managing powerflow of a multi-pack rechargeable energy storage system (RESS) having a parallel-connected first battery pack and second battery pack with different characteristics, wherein the first battery pack and the second battery pack have respective maximum current limits, the method comprising:
   predicting a corresponding first terminal voltage and second terminal voltage for the first battery pack and the second battery pack, respectively, via a controller using the respective maximum current limits;
   receiving, via the controller, a requested operating mode of the multi-pack RESS, wherein the requested operating mode is either a charging mode or a discharging mode of the multi-pack RESS;
   selecting the first terminal voltage or the second terminal voltage as a selected voltage based on the requested operating mode, including selecting a maximum of the first terminal voltage or the second terminal voltage when the requested operating mode is the discharging mode, and selecting a minimum of the first terminal voltage or the second terminal voltage when the requested operating mode is the charging mode;
   predicting a first pack current and a second pack current flowing through the first battery pack and the second battery pack, respectively, using the selected voltage and corresponding battery state space models;
   predicting a total power capability of the multi-pack RESS over a predetermined prediction horizon using the first pack current and the second pack current to thereby generate a plurality of predicted power capability values; and
   controlling the requested operating mode over the predetermined prediction horizon, via the controller, using the plurality of predicted power capability values.

2. The method of claim 1, the method further comprising:
   receiving a fast-charging voltage and current from an offboard fast-charging station, via the multi-pack RESS, during a fast-charging operation;
   wherein the requested operating mode is the charging mode, and controlling the requested operating mode occurs during the charging mode by controlling the fast-charging operation via the controller.

3. The method of claim 1, wherein the requested operating mode is the discharging mode, and wherein controlling the requested operating mode includes energizing a rotary electric machine via the multi-pack RESS and a power inverter module.

4. The method of claim 1, wherein the predetermined prediction horizon includes at least five future time points.

5. The method of claim 1, wherein the controller includes hierarchically-arranged first and second controllers, predicting the second terminal voltage is accomplished via the second controller using a second one of the battery state space models and communicated to the first controller, predicting the first terminal voltage is accomplished via the first controller using a first of the battery state space models, and predicting the total power capability and controlling the requested operating mode is accomplished via the first controller.

6. The method of claim 5, wherein the first and second controllers are first and second vehicle integration control modules (VICMs) of a motor vehicle.

7. The method of claim 1, wherein the multi-pack RESS includes a third battery pack connected to the first and second battery packs via a DC-DC converter, such that the third battery pack has a pack voltage that is less than a pack voltage of the first and second battery packs.

8. The method of claim 7, wherein the third battery pack has a pack voltage of 48V and the first and second battery packs have a pack voltage of at least 370V.

9. A powertrain system comprising:
a multi-pack rechargeable energy storage system (RESS) having:
a parallel-connected first battery pack and second battery pack; and
a first pack sensor and a second pack sensor connected to the respective first and second battery packs, each of the first pack sensor and the second pack sensor being configured to measure a corresponding pack current, voltage, and temperature of the first battery pack and the second battery pack;
a power inverter module (PIM) connected to the multi-pack RESS;
a rotary electric machine connected to the PIM and having an output member coupled to a load; and
a controller in communication with the first pack sensor and the second pack sensor, and operable for managing powerflow of the multi-pack RESS using the measured pack current, voltage, and temperature, wherein the controller is programmed with a corresponding maximum current limit of the first battery pack and the second battery pack, and is configured to:
predict a first terminal voltage and a second terminal voltage for the first battery pack and the second battery pack, respectively, using the corresponding maximum current limit;
receive a requested operating mode of the multi-pack RESS, wherein the requested operating mode is either a charging mode or a discharging mode of the multi-pack RESS;
select the first terminal voltage or the second terminal voltage as a selected voltage based on the requested operating mode, the selected voltage including a maximum of the first terminal voltage or the second terminal voltage when the requested operating mode is the discharging mode and a minimum of the first terminal voltage or the second terminal voltage when the requested operating mode is the charging mode;
predict a pack current flowing through each of the first battery pack and the second battery pack using the selected voltage and corresponding battery state space models;
predict a total power capability of the multi-pack RESS over a predetermined prediction horizon using the pack current of the first battery pack and the second battery pack to thereby generate a plurality of predicted power capability values; and
control the requested operating mode over the predetermined prediction horizon using the plurality of predicted power capability values.

10. The powertrain system of claim 9, wherein the multi-pack RESS is configured to receive a fast-charging voltage and current from an offboard fast-charging station during a fast-charging operation, the requested operating mode is the charging mode, and the controller is configured to control the fast-charging operation during the charging mode.

11. The powertrain system of claim 9, wherein the requested operating mode is the discharging mode, and wherein the controller is configured to control the requested operating mode by energizing the rotary electric machine via the multi-pack RESS and the power inverter module.

12. The powertrain system of claim 9, wherein the predetermined prediction horizon includes at least five future time points.

13. The powertrain system of claim 12, wherein relative to a current time point (k)=0 seconds (s), the at least five future time points include k=0.1 s, 1 s, 2 s, 10 s, and 20 s.

14. The powertrain system of claim 9, wherein the controller includes hierarchically-arranged first and second controllers, the second controller is configured to predict the second terminal voltage using a second one of the battery state space models and communicate the second terminal voltage to the first controller, and the first controller is configured to predict the terminal voltage using a first one of the battery state space models, predict the total power capability, and control the requested operating mode.

15. The powertrain system of claim 14, wherein the first and second controllers are respective first and second vehicle integration control modules (VICMs) of a motor vehicle, and wherein the load is a set of road wheels of the motor vehicle.

16. The powertrain system of claim 9, wherein each of the battery state space models include a plurality of battery parameters for the first battery pack and the second battery pack, respectively, including a state of charge, and open circuit voltage, and a battery impedance.

17. The powertrain system of claim 9, wherein the multi-pack RESS includes a third battery pack connected to the first battery pack and the second battery pack via a DC-DC converter, such that the third battery pack has a pack voltage that is less than a pack voltage of the first battery pack and the second battery pack.

18. The powertrain system of claim 17, wherein the third battery pack has a pack voltage of 48V, and the first battery pack and the second battery pack each have a respective pack voltage of at least 370V.

* * * * *